US011538668B2

(12) United States Patent
Sasaki et al.

(10) Patent No.: US 11,538,668 B2
(45) Date of Patent: Dec. 27, 2022

(54) MOUNTING STAGE, SUBSTRATE PROCESSING DEVICE, AND EDGE RING

(71) Applicant: Tokyo Electron Limited, Tokyo (JP)

(72) Inventors: Yasuharu Sasaki, Miyagi (JP); Kyo Tsuboi, Miyagi (JP); Tomoya Kato, Miyagi (JP); Shoichiro Matsuyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 7 days.

(21) Appl. No.: 16/642,542

(22) PCT Filed: May 29, 2019

(86) PCT No.: PCT/JP2019/021280
§ 371 (c)(1),
(2) Date: Feb. 27, 2020

(87) PCT Pub. No.: WO2019/239893
PCT Pub. Date: Dec. 19, 2019

(65) Prior Publication Data
US 2020/0194239 A1 Jun. 18, 2020

(30) Foreign Application Priority Data

Jun. 12, 2018 (JP) .............................. JP2018-112276

(51) Int. Cl.
H01J 37/32 (2006.01)
H01L 21/67 (2006.01)
H01L 21/683 (2006.01)

(52) U.S. Cl.
CPC .. *H01J 37/32642* (2013.01); *H01J 37/32724* (2013.01); *H01L 21/67069* (2013.01);
(Continued)

(58) Field of Classification Search
CPC ........... H01J 37/32642; H01J 37/32724; H01J 2237/3341; H01J 2237/3344; H01J 37/32;
(Continued)

(56) References Cited

U.S. PATENT DOCUMENTS 6,585,851 B1 * 7/2003 Ohmi ................ H01J 37/32082
156/345.46
2009/0223810 A1 * 9/2009 Dhindsa ............ H01J 37/32642
204/164

(Continued)

FOREIGN PATENT DOCUMENTS

JP 2007-201355 A 8/2007
JP 2007201355 A * 8/2007
(Continued)

*Primary Examiner* — Ram N Kackar
*Assistant Examiner* — Laureen Chan
(74) *Attorney, Agent, or Firm* — Nath, Goldberg & Meyer; Jerald L. Meyer; Tanya E. Harkins

(57) ABSTRACT

Provided is a mounting stage on which a substrate to be subjected to a plasma process is mounted. The mounting stage includes: an electrostatic chuck configured to attract the substrate and an edge ring disposed around the substrate; and supply holes through which a heat medium is supplied to a space between the electrostatic chuck and the edge ring. A groove is provided in at least one of the edge ring and the mounting stage, and the groove is not in communication with the supply holes.

10 Claims, 5 Drawing Sheets

(52) U.S. Cl.
CPC .. *H01L 21/6833* (2013.01); *H01J 2237/3341* (2013.01); *H01J 2237/3344* (2013.01)

(58) Field of Classification Search
CPC ........... H01L 21/67069; H01L 21/6833; H01L 21/6831; H01L 21/68735; H01L 21/68785; H01L 21/68721; C23C 16/4585; C23C 16/4586; C23C 16/46; C23C 16/463; C23C 16/466
See application file for complete search history.

(56) References Cited

U.S. PATENT DOCUMENTS

| | | | | |
|---|---|---|---|---|
| 2010/0012274 | A1* | 1/2010 | Miyagawa | H01L 21/68735 156/345.37 |
| 2010/0300622 | A1* | 12/2010 | Yatsuda | H01J 37/32642 156/345.44 |
| 2010/0326957 | A1* | 12/2010 | Maeda | H01L 21/68735 216/67 |
| 2011/0000883 | A1* | 1/2011 | Endoh | H01J 37/32082 216/67 |
| 2012/0160808 | A1* | 6/2012 | Kikuchi | H01L 21/6831 216/67 |
| 2015/0053348 | A1* | 2/2015 | Nagayama | H01J 37/3266 156/345.37 |
| 2016/0189994 | A1* | 6/2016 | Sasaki | H01L 21/6833 361/234 |
| 2020/0251371 | A1* | 8/2020 | Kuno | H01L 21/6833 |

FOREIGN PATENT DOCUMENTS

| | | |
|---|---|---|
| JP | 2010-183074 A | 8/2010 |
| JP | 2010-278166 A | 12/2010 |
| JP | 2016-122740 A | 7/2016 |
| WO | 9839500 A1 | 9/1998 |

* cited by examiner

FIG. 4

| | (a) Comparative Example 1 non groove | (b) Comparative Example 2 with groove (annular) | (c) Present embodiment with groove (fan-shaped) |
|---|---|---|---|
| Supply holes | He flow (sccm) | | |
| Slot1 | 1.4 | 3.6 | 0.9 |
| Slot2 | 1.5 | 4.7 | 0.9 |
| Slot3 | 1.6 | 5.0 | 0.9 |
| Edge ring cross-sectional view | A-A cross section | B-B cross section | C-C cross section |
| Electrostatic chuck front view | | | |
| Edge ring rear view | | | |

MOUNTING STAGE, SUBSTRATE PROCESSING DEVICE, AND EDGE RING

This is a National Phase Application filed under 35 U.S.C. 371 as a national stage of PCT/JP2019/021280, filed May 29, 2019, an application claiming the benefit of Japanese Application No. 2018-112276, filed Jun. 12, 2018, the content of each of which is hereby incorporated by reference in its entirety.

TECHNICAL FIELD

The present disclosure relates to a mounting stage, a substrate processing apparatus, and an edge ring.

BACKGROUND

For example, Patent Document 1 proposes a substrate processing apparatus including an electrostatic chuck configured to mount a wafer thereon, an edge ring disposed on the electrostatic chuck to surround the wafer, and a heat transfer gas introduction groove filled with a heat medium for performing heat exchange with the edge ring. The substrate processing apparatus includes a controller that controls a chuck voltage applied to an electrode plate provided in the electrostatic chuck for electrostatically attracting the edge ring to the electrostatic chuck.

PRIOR ART DOCUMENT

Patent Document

Patent Document 1: Japanese laid-open publication No. 2010-183074

SUMMARY

The present disclosure provides a technique capable of suppressing occurrence of discharge in supply holes that supply a heat medium for performing heat exchange with an edge ring.

According to an aspect of the present disclosure, there is provided a mounting stage on which a substrate to be subjected to a plasma process is mounted, the mounting stage including: an electrostatic chuck configured to attract the substrate and an edge ring disposed around the substrate; and supply holes through which a heat medium is supplied to a space between the electrostatic chuck and the edge ring. A groove is provided in at least one of the edge ring and the mounting stage, and the groove is not in communication with the supply holes.

According to the aspect, it is possible to suppress occurrence of discharge in supply holes that supply a heat medium for performing heat exchange with an edge ring.

BRIEF DESCRIPTION OF DRAWINGS

FIG. 4 is a view showing an example of experimental results of flow rates of heat transfer gases supplied from supply holes according to an embodiment and Comparative Examples 1 and 2.

DETAILED DESCRIPTION

Figure 1:
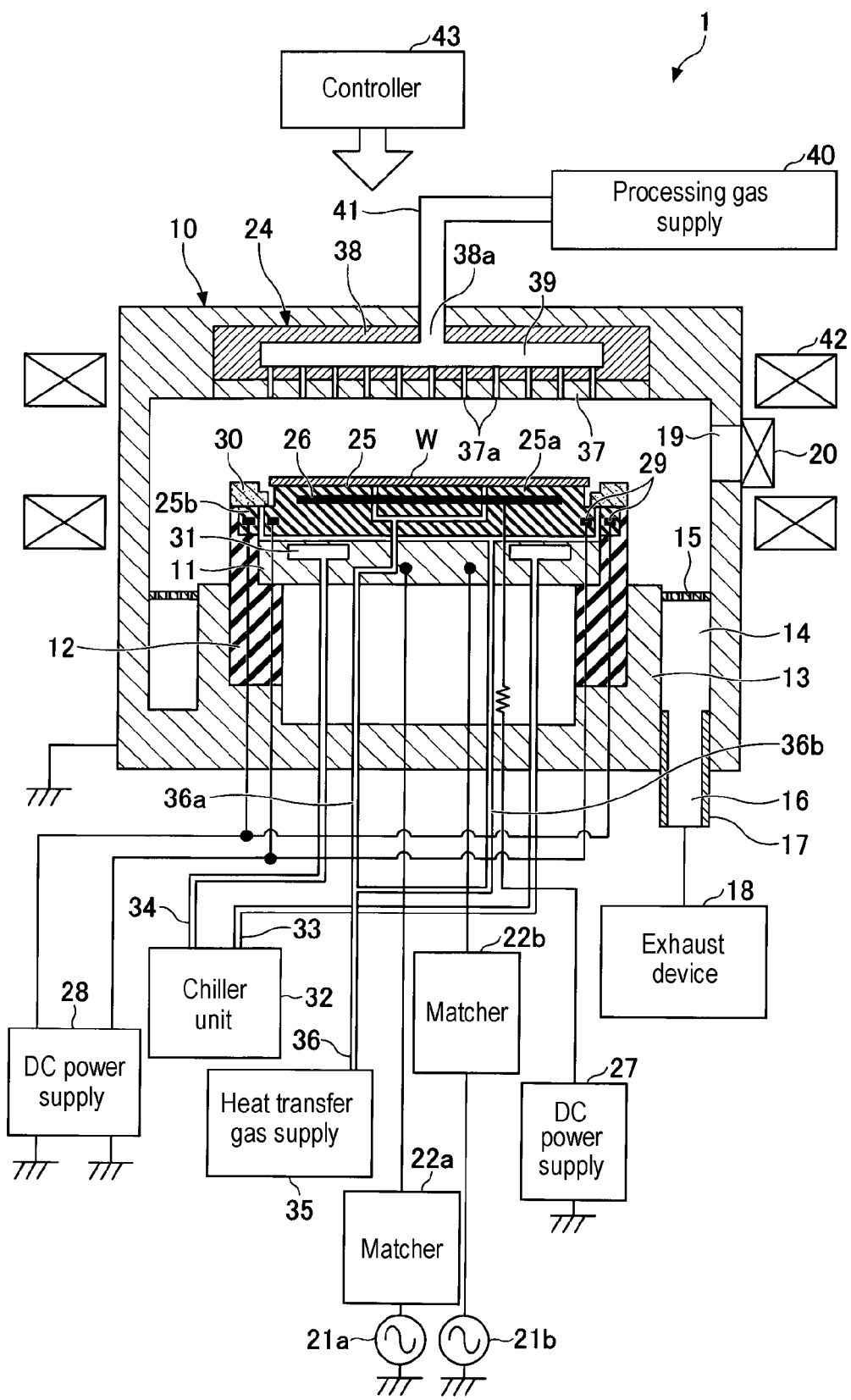
FIG. 1 is a view illustrating an example of a substrate processing device including a mounting stage according to an embodiment.

Hereinafter, embodiments for implementing the present disclosure will be described with reference to drawings. In the specification and drawings, constituent elements that are substantially the same will be denoted by the same reference numerals, and redundant descriptions will be omitted.

[Overall Configuration of Substrate Processing Device]

First, an example of an overall configuration of a substrate processing device 1 will be described with reference to FIG. 1. FIG. 1 is a cross-sectional view illustrating a schematic configuration of the substrate processing device 1 according to an embodiment. In the present embodiment, an example in which the substrate processing device 1 is a reactive ion etching (RIE) type substrate processing device will be described. However, the substrate processing device 1 may be a plasma etching apparatus, a plasma chemical vapor deposition (CVD) apparatus, or the like.

In FIG. 1, the substrate processing device 1 has a grounded cylindrical processing container 10 made of metal, for example, aluminum or stainless steel, and a disk-shaped mounting stage 11 on which a wafer W is mounted is disposed inside the processing container 10. The mounting stage 11 also functions as a lower electrode. The mounting stage 11 is made of, for example, aluminum, and is supported by a cylindrical support 13, which extends vertically upward from the bottom of the processing container 10, via a cylindrical insulating holder 12.

An exhaust path 14 is formed between the side wall of the processing container 10 and the cylindrical support 13. An annular baffle plate 15 is disposed at the entrance or in the middle of the exhaust path 14, and an exhaust port 16 is provided at a bottom portion of the exhaust path 14. An exhaust device 18 is connected to the exhaust port 16 via an exhaust pipe 17. Here, the exhaust device 18 has a dry pump and a vacuum pump, and depressurizes a processing space in the processing container 10 to a predetermined degree of vacuum. The exhaust pipe 17 has an automatic pressure control valve (hereinafter, referred to as "APC") which is a variable butterfly valve, and the APC automatically controls the pressure inside the processing container 10. In addition, a gate valve 20 is provided on the side wall of the processing container 10 to open and close a loading/unloading port 19 of the wafer W.

A first high-frequency power supply 21a is connected to the mounting stage 11 via a first matcher 22a. In addition, a second high-frequency power supply 21b is connected to the mounting stage 11 via a second matcher 22b. The first high-frequency power supply 21a supplies high-frequency power for plasma generation of a predetermined frequency (e.g., 100 MHz) to the mounting stage 11. The second high-frequency power supply 21b supplies high-frequency power for ion attraction of a predetermined frequency (e.g., 13 MHz), which is lower than that of the first high-frequency power supply 21a, to the mounting stage 11.

A shower head 24, which also functions as an upper electrode, is disposed at a ceiling portion of the processing container 10. As a result, high frequency voltages of two frequencies from the first high-frequency power supply 21a and the second high-frequency power supply 21b are applied between the mounting stage 11 and the shower head 24.

On the top surface of the mounting stage 11, an electrostatic chuck 25 is provided to attract the wafer W by an electrostatic attraction force. The electrostatic chuck 25 has a disk-shaped central portion 25a on which the wafer W is mounted, and an annular outer peripheral portion 25b formed to surround the central portion 25a. The central portion 25a protrudes upward in the drawings with respect to the outer peripheral portion 25b. On the top surface of the outer peripheral portion 25b, an edge ring 30 annularly surrounding the central portion 25a is mounted. The edge ring 30 is also referred to as a focus ring. The central portion 25a is formed by sandwiching an electrode plate 26 made of a conductive film between a pair of dielectric films.

The outer peripheral portion 25b is formed by sandwiching an electrode plate 29 made of a conductive film between a pair of dielectric films. In the present embodiment, two electrode plates 29 are arranged side by side in an annular axial direction. A DC power supply 27 is electrically connected to the electrode plate 26. A DC power supply 28 is individually and electrically connected to each of the two electrode plates 29. The DC power supply 27 and the DC power supply 28 are configured to be able to change levels and polarities of DC voltages supplied therefrom. The DC power supply 27 applies a DC voltage to the electrode plate 26 under a control of a controller 43 to be described later. The DC power supply 28 individually applies a DC voltage to each of the two electrode plates 29 under the control of the controller 43. The electrostatic chuck 25 generates an electrostatic force such as Coulomb force by the voltage applied to the electrode plate 26 from the DC power supply 27, and attracts and holds the wafer W to the electrostatic chuck 25 by the electrostatic force. The electrostatic chuck 25 generates an electrostatic force such as Coulomb force by the voltage applied to the electrode plates 29 from the DC power supply 28, and attracts and holds the edge ring 30 to the electrostatic chuck 25 by the electrostatic force.

The DC power supply 27 is an example of a method of applying a voltage to a first electrode configured to attract the wafer W mounted on the mounting stage 11. The DC power supply 28 is an example of a method of applying a voltage to a second electrode configured to attract the edge ring 30 mounted on the mounting stage 11.

Inside the mounting stage 11, an annular coolant chamber 31 extending, for example, in a circumferential direction is provided. A coolant having a predetermined temperature, for example, cooling water, is circulated and supplied from a chiller unit 32 to the coolant chamber 31 via pipes 33 and 34, and the processing temperature of the wafer W on the electrostatic chuck 25 is controlled by the temperature of the coolant. Further, the coolant is an example of a temperature adjusting medium circulated and supplied to the pipes 33 and 34, and the temperature adjusting medium may not only cool the mounting stage 11 and the wafer W, but also heat the mounting stage 11 and the wafer W.

A heat transfer gas supply 35 is connected to the electrostatic chuck 25 via a gas supply line 36. The gas supply line 36 is branched into a wafer-side line 36a reaching the central portion 25a of the electrostatic chuck 25 and an edge ring-side line 36b reaching the outer peripheral portion 25b of the electrostatic chuck 25.

The heat transfer gas supply 35 supplies a heat transfer gas to a space between the central portion 25a of the electrostatic chuck 25 and the wafer W using the wafer-side line 36a. In addition, the heat transfer gas supply 35 supplies the heat transfer gas to a space between the outer peripheral portion 25b of the electrostatic chuck 25 and the edge ring 30 using the edge ring-side line 36b. As the heat transfer gas, a thermally conductive gas, for example, a He gas or the like, is appropriately used. The heat transfer gas is an example of a heat medium, and the heat transfer gas supply 35 is an example of a supply part that supplies the heat medium.

The shower head 24 of the ceiling portion has a lower electrode plate 37 having a plurality of gas vent holes 37a, and an electrode support 38 configured to detachably support the electrode plate 37. A buffer chamber 39 is provided inside the electrode support 38, and a processing gas supply 40 is connected to a gas inlet 38a in communication with the buffer chamber 39 via a gas supply pipe 41. In addition, a magnet 42 extending in an annular or concentric manner is disposed around the processing container 10.

Individual components of the substrate processing device 1 are connected to the controller 43. For example, the exhaust device 18, the first high-frequency power supply 21a, the second high-frequency power supply 21b, the DC power supply 27, the DC power supply 28, the chiller unit 32, the heat transfer gas supply 35, and the processing gas supply 40 are connected to the controller 43. The controller 43 controls the individual components of the substrate processing device 1.

The controller 43 includes a central processing unit (CPU) and a storage device such as a memory, which are not illustrated, and causes desired processes to be executed in the substrate processing device 1 by reading and executing a program and a processing recipe stored in the storage device. For example, the controller 43 performs an electrostatic attraction process for electrostatically attracting the edge ring 30.

Inside the processing container 10 of the substrate processing device 1, a horizontal magnetic field is formed in one direction by the magnet 42, and a vertical RF electric field is formed by the high-frequency voltages applied between the mounting stage 11 and the shower head 24. As a result, magnetron discharge is performed via the processing gas in the processing container 10, and plasma is generated from the processing gas near the surface of the mounting stage 11.

In the substrate processing device 1, at the time of a dry etching process, the gate valve 20 is first opened, and the wafer W as a processing target is loaded into the processing container 10 and mounted on the electrostatic chuck 25. Then, in the substrate processing device 1, a processing gas (e.g., a gas mixture of a $C_4F_8$ gas, an $O_2$ gas, and an Ar gas) is introduced from the processing gas supply 40 into the processing container 10 at a predetermined flow rate and flow rate ratio, and a pressure in the processing container 10 is set to a predetermined value by the exhaust device 18 or the like.

In addition, in the substrate processing device 1, high-frequency powers having frequencies different from each other are supplied to the mounting stage 11 from the first high-frequency power supply 21a and the second high-frequency power supply 21b. In the substrate processing device 1, a DC voltage is applied from the DC power supply 27 to the electrode plate 26 of the electrostatic chuck 25 to attract the wafer W to the electrostatic chuck 25. In the substrate processing device 1, a DC voltage is applied from the DC power supply 28 to the electrode plates 29 of the electrostatic chuck 25 to attract the edge ring 30 to the electrostatic chuck 25. The processing gas discharged from the shower head 24 is converted into plasma, and the wafer W is subjected to an etching process by radicals and ions in the plasma.

[Structure of Groove]

Figure 2:
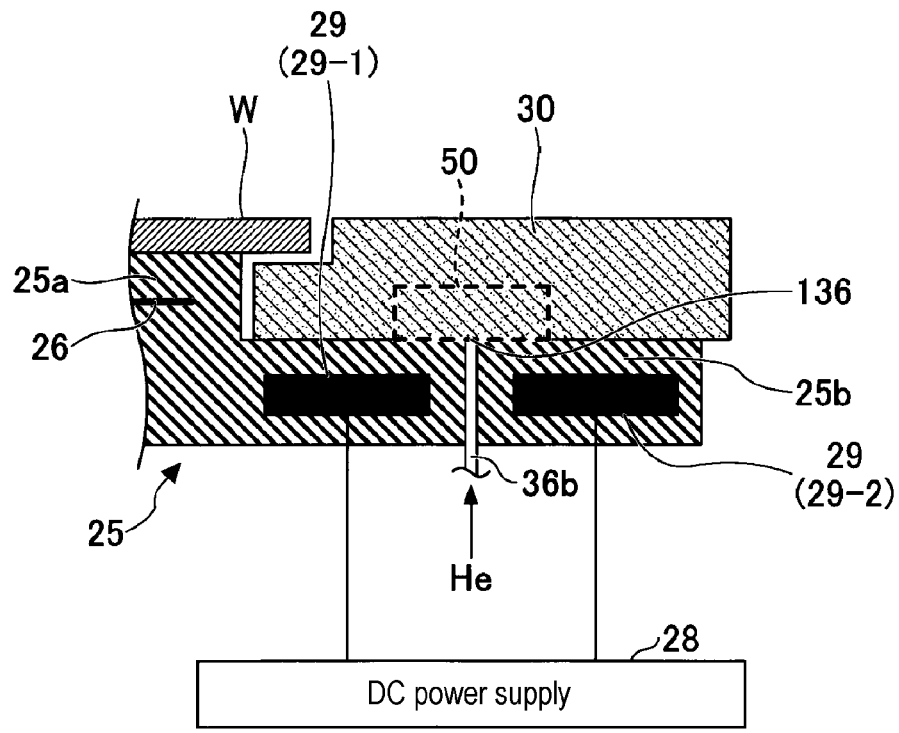
FIG. 2 is a view illustrating an example of an installation mode of an electrode plate according to an embodiment.

Next, an example of an installation mode of the electrode plates 29 illustrated in FIG. 1 will be described with reference to FIG. 2. FIG. 2 is a view illustrating an example of an installation mode of the electrode plates. The two electrode plates 29 illustrated in FIG. 2 are provided inside the outer peripheral portion 25b of the electrostatic chuck 25 and in an area corresponding to the edge ring 30. Hereinafter, of the two electrode plates 29, the inner electrode plate 29 will be referred to as an inner peripheral electrode plate 29-1, and the outer electrode plate 29 will be referred to as an outer peripheral electrode plate 29-2.

The inner peripheral electrode plate 29-1 is annularly disposed at the side of the inner periphery of the edge ring 30. The outer peripheral electrode plate 29-2 is annularly disposed at the side of the outer periphery of the edge ring 30. The inner peripheral electrode plate 29-1 and the outer peripheral electrode plate 29-2 are electrically connected to the DC power supply 28. In the present embodiment, a case in which a voltage is supplied from one DC power supply 28 to the inner peripheral electrode plate 29-1 and the outer peripheral electrode plate 29-2 is described. However, two DC power supplies 28 may be provided correspondingly to the inner peripheral electrode plate 29-1 and the outer peripheral electrode plate 29-2, respectively, and voltages may be supplied individually.

The edge ring-side line 36b reaching the outer peripheral portion 25b of the electrostatic chuck 25 is provided between the inner peripheral electrode plate 29-1 and the outer peripheral electrode plate 29-2, and supplies the heat transfer gas. The heat transfer gas passes through the edge ring-side line 36b and is supplied to a space between the electrostatic chuck 25 and the edge ring 30 from supply holes 136.

A groove 50 (see FIG. 4C) is provided in the rear surface of the edge ring 30. The groove 50 changes an impedance with respect to the high-frequency powers (RF powers) from the first high-frequency power supply 21a and the second high-frequency power supply 21b, and adjusts a balance between a high-frequency current flowing on the side of the wafer W and a high-frequency current flowing on the side of the edge ring 30. Thus, by making a state of the plasma on the wafer W and a state of the plasma on the edge ring 30 to be the same, it is possible to suppress tilting that may occur at the edge of the wafer W in a plasma etching process.

For example, when an impedance of the edge ring 30 side is lower than that of the wafer W side, a ratio of the high-frequency current flowing toward the edge ring 30 to the high-frequency current flowing on the wafer W side increases, and a plasma density on the side of the edge ring 30 increases. As a result, an incident angle of ions incident on the edge of the wafer W is tilted, and tilting occurs. Therefore, in the present embodiment, the groove 50 is formed in the edge ring 30 in order to adjust the impedance of the edge ring 30 side, thereby adjusting the balance between the high-frequency current flowing on the wafer W side and the high-frequency current flowing on the edge ring 30 side.

However, if the groove 50 is formed above the supply holes 136 of the heat transfer gas, a straight traveling distance of electrons passing through the edge ring-side line 36b and exiting from the supply holes 136 increases, and thus abnormal discharge is likely to occur.

Figure 3:
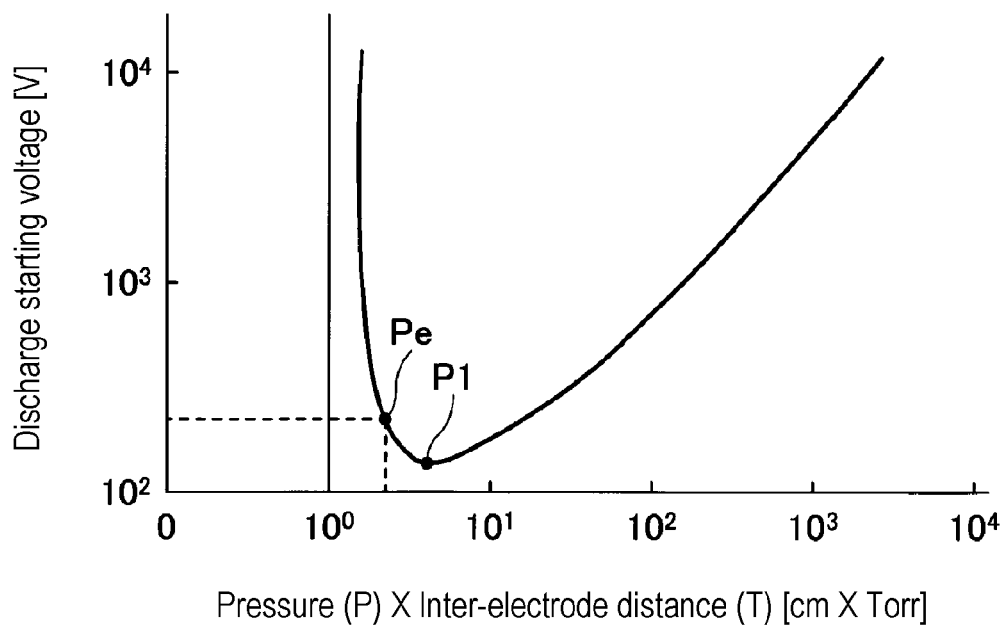
FIG. 3 is a graph illustrating a discharge starting voltage curve according to Paschen's law.

In FIG. 3 illustrating a discharge starting voltage curve according to Paschen's law, the minimum value P1 represents a value of (P×T) at which discharge is most likely to occur, where P denotes a pressure and T denotes an inter-electrode distance. Accordingly, by avoiding the minimum value P1, the discharge starting voltage can be increased, which makes occurrence of discharge difficult.

For example, in the curve on the left side of the minimum value P1, when the pressure is set to be constant, as the inter-electrode distance T is shortened, the discharge starting voltage is increased and it becomes more difficult for discharge to occur. When the groove 50 is provided at a location above the supply holes 136 of the edge ring 30, the inter-electrode distance is increased by the space (length) of the groove 50, and the value of (pressure×inter-electrode distance) becomes close to the minimum value P1 and it becomes easier for discharge to occur.

When abnormal discharge occurs, electrons move between the rear surface of the edge ring 30 and the front surface of the electrostatic chuck 25, and the rear surface of the edge ring 30 and the front surface of the electrostatic chuck 25 are instantaneously short-circuited. Thus, the electrostatic attraction force of the edge ring 30 decreases. As the electrostatic attraction force decreases, the flow rate of the heat transfer gas on the rear surface of the edge ring 30 gradually increases. Then, since the pressure of the heat transfer gas flowing on the rear surface of the edge ring 30 does not become constant, the processing temperature of the edge ring 30 does not become uniform, and etching uniformity deteriorates.

From the above, in the mounting stage 11 according to the present embodiment, the groove 50 is not provided above the supply holes 136. Thus, it is possible to prevent the straight traveling distance of the electrons derived from the supply holes 136 from extending by the space of the groove 50. As a result, it is possible to suppress abnormal discharge on the rear surface of the edge ring 30, and it is possible to prevent the electrostatic attraction force of the edge ring 30 from decreasing. This makes the pressure of the heat transfer gas flowing on the rear surface of the edge ring 30 constant, so that the processing temperature of the edge ring 30 is uniformly controlled. Thus, it is possible to achieve etching uniformity, and thus realize a stable process.

[Experimental Results]

FIG. 4 is a view representing an example of experimental results of flow rates of heat transfer gases (here, a He gas) supplied from the supply holes 136 provided in the present embodiment and Comparative Examples 1 and 2 having different groove shapes from that of the present embodiment. The "Edge ring cross-sectional view" of Comparative Example 1 in FIG. 4 illustrates an A-A cross section of the lowermost "Edge ring rear view." The "Edge ring cross-sectional view" of Comparative Example 2 in FIG. 4 illustrates a B-B cross section of the lowermost "Edge ring rear view." The "Edge ring cross-sectional view" of the present embodiment in FIG. 4 illustrates a C-C cross section of the lowermost "Edge ring rear view."

As illustrated in FIG. 4, six supply holes 136 of the edge ring-side line 36b, which are provided in the outer peripheral portion 25b of the electrostatic chuck 25 as illustrated in the edge ring cross-sectional view, are formed at equidistance intervals along a circumference in the surface of the outer peripheral portion 25b of the electrostatic chuck 25, as illustrated in the electrostatic chuck front view.

In Comparative Example 1 of FIG. 4, no groove is provided in the rear surface of the edge ring 30, as illustrated in the edge ring rear view.

In Comparative Example 2 of FIG. 4, an annular groove 49 is provided in the rear surface of the edge ring 30 at a location corresponding to the circumference where the supply holes 136 are arranged, as illustrated in the edge ring rear view. The groove 49 is in communication with the supply holes 136 illustrated in the electrostatic chuck front view.

In the present embodiment of FIG. 4, as illustrated in the edge ring rear view, fan-shaped grooves 50 are provided in the rear face of the edge ring 30 at a location corresponding to the circumference where the supply holes 136 are arranged. However, in the present embodiment, the grooves 50 in the rear surface of the edge ring 30 are not provided above the supply holes 136. That is, the grooves 50 and the supply holes 136 are not in communication with each other.

"Slot 1," "Slot 2," and "Slot 3" in FIG. 4 represent the experimental results. In the experiments, for all cases of Comparative Examples 1 and 2 and the present embodiment, the DC voltage applied to the inner peripheral electrode plate 29-1 and the outer peripheral electrode plate 29-2 of the electrostatic chuck 25 was set to be 3.25 kV. Further, in each of Comparative Examples 1 and 2 and the present embodiment, three wafers of an arbitrary lot were denoted as Slot1, Slot2, and Slot3, and an average flow rate of the He gas supplied from the edge ring-side line 36b was measured for each of the slots.

As a result, in Comparative Example 1, the flow rates of the He gas supplied from Slot1 to Slot3 were 1.4 sccm, 1.5 sccm, and 1.6 sccm, respectively. Further, in Comparative Example 2, the flow rates of the He gas supplied from Slot1 to Slot3 were 3.6 sccm, 4.7 sccm, and 5.0 sccm, respectively. In contrast, in the present embodiment, the flow rates of the He gas supplied from Slot1 to Slot3 were all 0.9 sccm.

That is, from the experimental results of Comparative Examples 1 and 2, in the case of Comparative Example 2, since the groove 49 was provided in the rear surface of the edge ring 30, the flow rates of the He gas were increased compared with those in Comparative Example 1 in which no groove was provided in the rear surface of the edge ring 30.

In Comparative Example 1, since no groove was provided in the rear surface of the edge ring 30, the straight traveling distance of electrons does not increase as in Comparative Example 2. Therefore, it is difficult for abnormal discharge to occur. However, in Comparative Example 1, the impedance at the time of applying the high-frequency powers from the first high-frequency power supply 21a and the second high-frequency power supply 21b cannot be changed. Accordingly, the balance between the high-frequency current flowing on the wafer W side and the high-frequency current flowing on the edge ring 30 side cannot be adjusted. As a result, the state of the plasma on the wafer W and the state of the plasma on the edge ring 30 became different from each other, and thus tilting, which occurs at the edge of the wafer W in a plasma etching process, cannot be suppressed.

In Comparative Example 2, since the supply holes 136 are in communication with the groove 49, the straight traveling distance of electrons exiting from the supply holes 136 is longer than the straight traveling distance of electrons in Comparative Example 1, and it became easier for abnormal discharge to occur. When an abnormal discharge occurs, a movement of electrons takes place between the rear surface of the edge ring 30 and the front surface of the electrostatic chuck 25, which become short-circuited instantaneously. Thus, the electrostatic attraction force of the edge ring 30 is decreased. As the electrostatic attraction force is decreased, the flow rate of the He gas on the rear surface of the edge ring 30 increases.

In contrast, as shown in the present embodiment, by forming the fan-shaped grooves 50 without providing the grooves 50 above the supply holes 136, it became difficult for abnormal discharge to occur. Thus, it was possible to avoid a decrease in the electrostatic attraction force of the edge ring 30, and to make the flow rate of the He gas in each of the slots uniform.

In other words, the electrons in the edge ring-side line 36b are accelerated by the high-frequency currents from the first high-frequency power supply 21a and the second high-frequency power supply 21b. When the supply holes 136 are in communication with the groove 49 and the travel distance of electrons is long as in Comparative Example 2, since the distance over which the electrons are accelerated is long, the accelerated electrons ionize the He gas. When an ionized amount of the He gas increases, electrons move between the rear surface of the edge ring 30 and the front surface of the electrostatic chuck 25, which become short-circuited instantaneously. Thus, the electrostatic attraction force of the edge ring 30 decreases. As a result, a flow rate control of the He gas flowing between the rear surface of the edge ring 30 and the front surface of the electrostatic chuck 25 increases, and the processing temperature of the edge ring 30 is not uniform. Thus, etching uniformity deteriorates.

Meanwhile, when the supply holes 136 are not in communication with the grooves 50 as in the present embodiment and the travel distance of electrons is shorter than that in Comparative Example 2, the distance over which the electrons are accelerated is short. Thus, the electrons collide with and are absorbed by the wall or the like before being accelerated to such an extent that the electrons ionize the He gas, so that no discharge phenomenon occurs. As a result, electrons do not move between the rear surface of the edge ring 30 and the front surface of the electrostatic chuck 25, and thus the electrostatic attraction force of the edge ring 30 is maintained.

In the edge ring 30 according to the present embodiment, the interval between the grooves 50 is larger than the diameter of the He gas supply holes 136, and no groove 50 is provided above the supply holes 136. As a result, the straight traveling distance of electrons does not increase as in Comparative Example 2. For this reason, it is possible to suppress discharge in the supply holes 136 for supplying the He gas to the rear surface of the edge ring 30 for performing heat exchange with the edge ring 30. Thus, by making the pressure of the He gas flowing between the rear surface of the edge ring 30 and the front surface of the outer peripheral portion 25b of the electrostatic chuck 25 constant, the processing temperature of the edge ring 30 is controlled to be uniform. Accordingly, it is possible to achieve etching uniformity, and thus realize a stable process.

The grooves 50 may have any shape as long as the condition that no groove 50 is provided above the supply holes 136 is satisfied. The grooves 50 are an example of a first groove provided in the rear surface of the edge ring 30.

Modification Examples

In the edge ring 30 according to the present embodiment, the grooves 50 are formed in the rear surface of the edge ring 30. As a result, the impedance with respect to the high-frequency powers applied from the first high-frequency power supply 21a and the second high-frequency power supply 21b can be changed. For this reason, the balance between the high-frequency current flowing on the wafer W side and the high-frequency current flowing on the edge ring 30 side can be adjusted. As a result, since the states of the plasma on the wafer W and the edge ring 30 can be controlled to be the same as each other, it is possible to suppress tilting that may occur at the edge of the wafer W in a plasma etching process.

Figure 5:
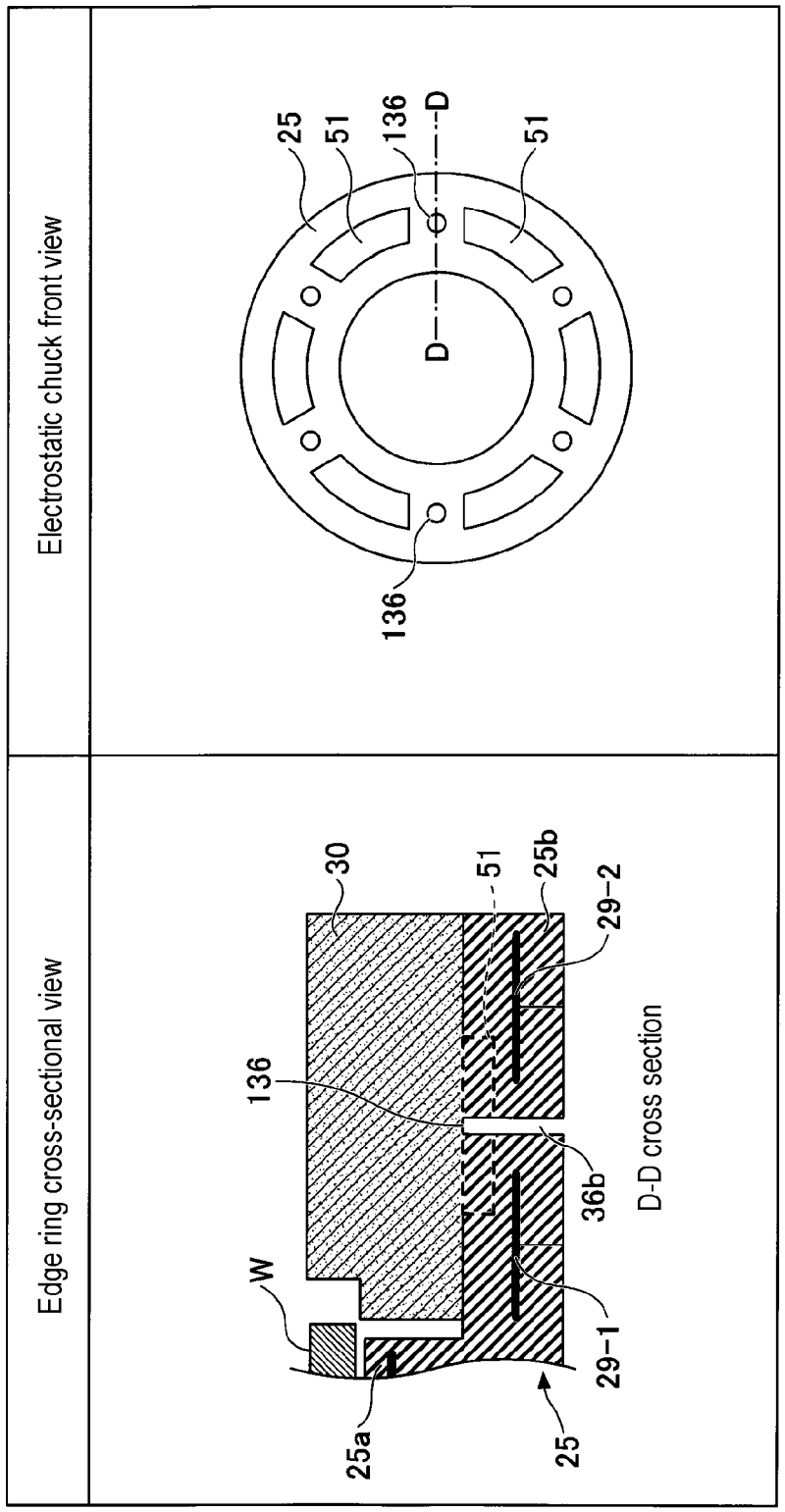
FIG. 5 is a view illustrating a modification of grooves according to an embodiment.
Figure 6:
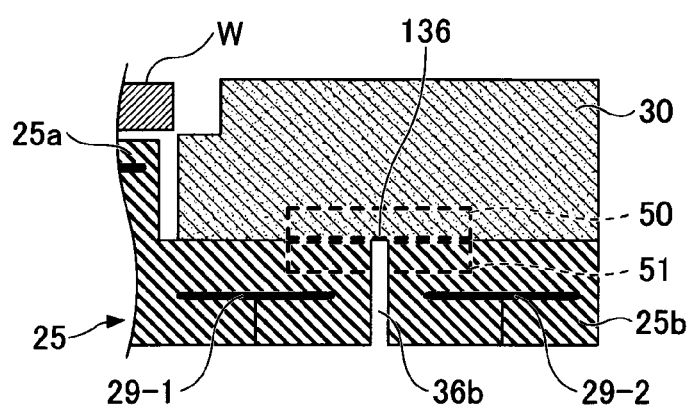
FIG. 6 is a view illustrating a modification of grooves according to an embodiment.

However, the grooves are not limited to being formed in the rear surface of the edge ring 30. As an example, a modification of the grooves according to one embodiment will be described with reference to FIGS. 5 and 6. FIGS. 5 and 6 are views illustrating a modification of the grooves according to the embodiment.

The cross-sectional view of the edge ring on the left side of FIG. 5 illustrates a D-D cross section on the right side of FIG. 5. As illustrated in the edge ring cross sectional view, fan-shaped grooves 51 may be provided in the surface of the outer peripheral portion 25b of the electrostatic chuck 25, on which the edge ring 30 is disposed. The grooves 51 are formed in a fan shape along the circumference in the surface of the electrostatic chuck 25 where the supply holes 136 are arranged. As illustrated in the electrostatic chuck front view, the supply holes 136 are provided between the grooves 51, and the grooves 51 are not in communication with the supply holes 136. In this case, the grooves 50 may not be provided in the rear surface of the edge ring 30.

Further, the grooves 51 may have any shape as long as the condition that the grooves 51 are not in communication with the supply holes 136 is satisfied. The grooves 51 are an example of a second groove provided in the surface of the mounting stage 11 on which the edge ring 30 is disposed.

As illustrated in FIG. 6, the grooves 50 may be provided in the rear surface of the edge ring 30 and the grooves 51 may also be provided in the surface of the mounting stage 11 on which the edge ring 30 is disposed. In this case as well, no groove 50 is provided above the supply holes 136, and the grooves 50 are not in communication with the supply holes 136. Similarly, the grooves 51 and the supply holes 136 are not in communication with each other.

For this reason, since the distance over which electrons are accelerated does not increase due to the grooves 50 and 51, the electrons collide with and are absorbed by the wall or the like before being accelerated to such an extent that electrons ionize the He gas, so that a discharge phenomenon does not occur. As a result, electrons do not move between the rear surface of the edge ring 30 and the front surface of the electrostatic chuck 25, and thus the electrostatic attraction force of the edge ring 30 is maintained. Thus, by making the pressure of the heat transfer gas flowing between the rear surface of the edge ring 30 and the outer peripheral portion 25b of the electrostatic chuck 25 constant, the processing temperature of the edge ring 30 is controlled to be uniform. Accordingly, it is possible to achieve etching uniformity, and thus realize a stable process.

In addition, the edge ring 30 may be an edge ring that is annularly divided into three portions of an inner portion, a central portion, and an outer portion, or an edge ring that is annularly divided into two portions of an inner portion and an outer portion. In these cases as well, no grooves are provided above the He gas supply holes 136, and the grooves are not in communication with the supply holes 136. Accordingly, discharge in the supply holes 136 for supplying the He gas for performing heat exchange with the edge ring can be suppressed.

It should be understood that the mounting stage, the substrate processing device, and the edge ring according to the embodiments disclosed herein are illustrative and not restrictive in all aspects. The above embodiments may be modified and improved in various forms without departing from the scope and spirit of the appended claims. The matters described in the above embodiments may take other configurations without contradiction, and may be combined without contradiction.

The substrate processing device of the present disclosure is applicable to any of a capacitively coupled plasma (CCP) type, an inductively coupled plasma (ICP) type, a radial line slot antenna (RLSA) type, an electron cyclotron resonance plasma (ECR) type, and a helicon wave plasma (HWP) type.

In the present disclosure, the wafer W has been described as an example of a substrate. However, the substrate is not limited thereto, and may be any of various substrates used for a flat panel display (FPD), a printed circuit board, or the like.

The present international application claims priority based on Japanese Patent Application No. 2018-112276 filed on Jun. 12, 2018, the disclosure of which are incorporated herein in its entirety by reference.

EXPLANATION OF REFERENCE NUMERALS

1: substrate processing device, 10: processing container, 11: mounting stage, 21a: first high-frequency power supply, 21b: second high-frequency power supply, 25: electrostatic chuck, 25a: central portion, 25b: outer peripheral portion, 26: electrode plate, 27: DC power supply, 28: DC power supply, 29: electrode plate, 29-1: inner peripheral electrode plate, 29-2: outer peripheral electrode plate, 30: edge ring, 36a: wafer-side line, 36b: edge ring-side line, 43: controller, 50: groove, 51: groove, 136: supply hole, W: wafer

What is claimed is:

1. A mounting stage on which a substrate to be subjected to a plasma process is mounted, the mounting stage comprising:

an electrostatic chuck configured to attract the substrate and an edge ring disposed around the substrate; and supply holes through which a heat medium is supplied to a space between the electrostatic chuck and the edge ring, wherein a groove is provided in at least one of a rear surface of the edge ring and a surface of the mounting stage on which the edge ring is disposed, wherein the groove includes a plurality of grooves at locations corresponding to a circumference where the supply holes are arranged, wherein the plurality of grooves are not in communication with the supply holes wherein the plurality of grooves are intermittently arranged to have predetermined intervals along the circumference, and wherein each of the plurality of grooves and each of the supply holes are alternately arranged one by one along the circumference.

2. The mounting stage of claim 1, wherein the groove includes a first group of a plurality of grooves provided in the rear surface of the edge ring.

3. The mounting stage of claim 2, wherein the groove includes a second group of a plurality of grooves provided in the surface of the mounting stage on which the edge ring is disposed.

4. The mounting stage of claim 3, wherein the electrostatic chuck includes a first electrode configured to attract the substrate mounted on the mounting stage and a second electrode configured to attract the edge ring.

5. The mounting stage of claim 1, wherein the groove includes a second group of a plurality of grooves provided in the surface of the mounting stage on which the edge ring is disposed.

6. The mounting stage of claim 1, wherein the electrostatic chuck includes a first electrode configured to attract the substrate mounted on the mounting stage and a second electrode configured to attract the edge ring.

7. A substrate processing device comprising:

a mounting stage on which a substrate is mounted;

an edge ring disposed around the substrate;

an electrostatic chuck configured to attract the edge ring and the substrate; and supply holes through which a heat medium is supplied to a space between the electrostatic chuck and the edge ring, wherein a groove is provided in at least one of a rear surface of the edge ring and a surface of the mounting stage on which the edge ring is disposed, wherein the groove includes a plurality of grooves at locations corresponding to a circumference where the supply holes are arranged, wherein the plurality of grooves are not in communication with the supply holes wherein the plurality of grooves are arranged to have predetermined intervals along the circumference, and wherein each of the plurality of grooves and each of the supply holes are alternately arranged one by one along the circumference.

8. An edge ring disposed around a substrate to be subjected to a plasma process, wherein a groove is provided in a rear surface of the edge ring, wherein the groove is not in communication with supply holes through which a heat medium is supplied to a space between the edge ring and an electrostatic chuck configured to attract the edge ring, wherein the groove includes a plurality of grooves at locations corresponding to a circumference where the supply holes are arranged, wherein the plurality of grooves are arranged to have predetermined intervals along the circumference, and wherein each of the plurality of grooves and each of the supply holes are alternately arranged one by one along the circumference.

9. The mounting stage of claim 1, wherein the groove is configured to change an impedance with respect to a high-frequency power.

10. The mounting stage of claim 1, wherein each of the plurality of grooves has a fan shape.

* * * * *